US005756564A

United States Patent [19]

Murata et al.

[11] Patent Number: 5,756,564
[45] Date of Patent: May 26, 1998

[54] EPOXY RESIN COMPOSITION FOR ENCAPSULATION OF SEMICONDUCTORS

[75] Inventors: Yasuyuki Murata; Yoshinori Nakanishi; Norio Tohriiwa, all of Yokkaichi, Japan

[73] Assignee: Shell Oil Company, Houston, Tex.

[21] Appl. No.: 806,883

[22] Filed: Feb. 25, 1997

[51] Int. Cl.$^6$ .............................. C08K 3/36; C08L 63/02
[52] U.S. Cl. .................................................. 523/466
[58] Field of Search ................................................ 523/466

[56] References Cited

U.S. PATENT DOCUMENTS

| 4,719,502 | 1/1988 | Ikeya et al. ........................... 357/72 |
| 5,162,400 | 11/1992 | Shiobara et al. ........................... 523/466 |

FOREIGN PATENT DOCUMENTS

| 54-155298 | 12/1979 | Japan . | |
| 04248828 | 9/1992 | Japan | C08G 59/24 |
| 4248828 | 9/1992 | Japan . | |

*Primary Examiner*—Melvyn I. Marquis
*Assistant Examiner*—D. Aylward
*Attorney, Agent, or Firm*—Dennis V. Carmen

[57] ABSTRACT

To provide an epoxy resin composition for encapsulation of semiconductors, which is superior in curability and can yield a cured product having low moisture absorption. The epoxy resin composition comprises the following components (a), (b), (c), and (d):

(a) Epoxy resin
(b) Epoxy resin hardener comprising a partially aromatic-esterified phenol aralkyl resin having a conversion of esterification of 10 to 90 mol % as the main component
(c) Silica powder filler
(d) Cure accelerator.

5 Claims, No Drawings

EPOXY RESIN COMPOSITION FOR ENCAPSULATION OF SEMICONDUCTORS

1. FIELD OF THE INVENTION

The present invention relates to an epoxy resin composition for encapsulation of semiconductor which is superior in curability and yields a cured product having a low moisture absorption.

2. BACKGROUND OF THE ART

In recent years, severe various characteristics are required to encapsulant of semiconductor elements in view of the increased degree of the integration of semiconductor elements. In particular, crack resistance at dipping in solder bath and rapid curability are the important subjects. However, epoxy resin compositions generally used at present cannot sufficiently be satisfied with the required characteristics.

For example, with the increased degree of the integration of the semiconductor elements and the large-sized semiconductor elements, the miniaturized and thinned packages are being put into practical use. In addition, the mounting technology for semiconductor elements is shifting into a surface mounting. Since the surface mounting is accomplished by directly dipping semiconductor elements into a solder bath, the semiconductors are exposed to high temperature, and as a result, the whole package undergoes large stress due to expansion of the absorbed moisture at such high temperature. This stress cracks the encapsulant. For this reason, low moisture absorption is required for the encapsulant superior in solder crack resistance. The epoxy resin encapsulant comprising a cresol novolak epoxy resin and a phenol novolak resin hardener, which is mainly used at present, is not yet sufficient in low moisture absorption.

Further, the encapsulation of semiconductor element is performed by low pressure transfer molding. With the rise in mass production, rapid curability is required for the epoxy resin encapsulant in order to increase the molding cycle.

Extensive studies have been made on the low moisture absorption for each of the epoxy resin and the hardener. The representative method is, for example, introducing a hydrophobic group such as dicyclopentane skeleton or xylene skeleton into the epoxy resin or the hardener as described in, for example, a Japanese Unexamined Patent Publication No. Hei. 4,248,828, or a Japanese Unexamined Patent Publication No. Hei. 5,301,946. However, the effect for achieving the low moisture absorption is not yet sufficient, and the solder crack resistance is not also sufficiently improved.

A Japanese Unexamined Patent Publication No. Sho. 62-53,327 discloses to achieve the low moisture absorption by esterifying a phenol compound as a hardener. However, since the reaction between ester group and epoxy group is slow, the requirements of the rapid curability cannot be satisfied.

An object of the present invention is to provide a novel epoxy resin composition for encapsulation of semiconductors, which is superior in curability and yields a cured product having a low moisture absorption.

3. SUMMARY OF THE INVENTION

As a result of various investigations to overcome the above-described problems in the prior art, it has been found that the object can be achieved by using, as a hardener, a compound having a specific skeleton and also having both ester group and phenolic hydroxyl groups as functional groups. The present invention has been completed based on this finding.

According to the present invention, there is provided an epoxy resin composition for encapsulation of semiconductors, which comprises the following components:

(a) Epoxy resin (b) Epoxy resin hardener comprising a partially aromatic-esterified phenol aralkyl resin represented by the following formula (I) as the main component

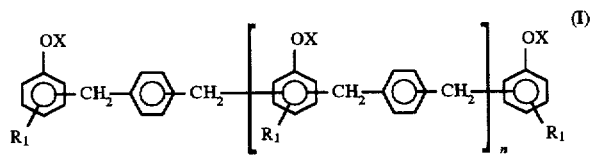

(where X represents hydrogen atom or a group represented by the following formula (II), with the proviso that 10 to 90 mol % of the total X is the group represented by the following formula (II), $R_1$ represents hydrogen atom, hydrocarbon group having 1 to 10 carbon atoms, substituted or unsubstituted aromatic group, substituted or unsubstituted aralkyl group, or halogen atom, and n is an integer of 0 to 10 on the average)

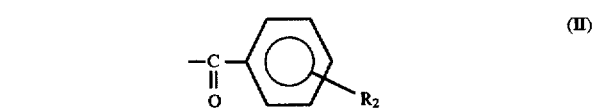

(where $R_2$ represents hydrogen atom, hydrocarbon group having 1 to 10 carbon atoms, substituted or unsubstituted aromatic group, substituted or unsubstituted aralkyl group, or halogen atom)

(c) Silica powder filler and a (d) Cure accelerator.

4. DETAILED DESCRIPTION OF THE INVENTION

In curing reaction of the epoxy resin composition for the encapsulation of semiconductors according to the present invention, epoxy group in the epoxy resin is inserted in carboxylic acid ester bond which is directly bonding aromatic rings with each other (this bond is hereinafter referred to as "aromatic ester bond" for simplicity) in the hardener, resulting in bonding the epoxy resin and the hardener, and also, the epoxy group adds to the phenolic hydroxyl group in the hardener, resulting in bonding the epoxy resin and the hardener, followed by polymerization and crosslinking to form a cured product.

In the above reaction in which the epoxy group is inserted in the aromatic ester bond, hydroxyl groups that form by the curing using conventional phenol hardeners, and increase moisture absorption, do not form at all. Therefore, such a reaction can provide a cured product superior in the moisture absorption.

In general, the reaction that inserts the epoxy group in the carboxylic acid ester bond is considerably slow. However, the "aromatic ester bond" employed in the present invention shows a relatively fast reaction, and further, by the action of the phenolic hydroxyl group consciously co-existed, sufficient rapid curability can be obtained.

The phenolic hydroxyl group in the hardener used in the epoxy resin composition for encapsulation of semiconductors of the present invention produces a hydroxyl group that increases moisture absorption, but adverse influence can be suppressed by adjusting the content thereof to an appropriate amount.

5. EMBODIMENT OF THE INVENTION

The present invention is explained in detail below.

The epoxy resin composition for encapsulation of semiconductors according to the present invention is an epoxy resin composition for encapsulation of semiconductors, which comprises a formulation of (a) epoxy resin, (b) epoxy resin hardener, (c) silica powder filler, and (d) cure accelerator as the essential components. There is no particular restriction on the epoxy resin (a), and general epoxy resins can be used.

Examples of the epoxy resin (a) which can be used in the present invention include epoxy resins produced from various phenols (e.g., bisphenol A, bisphenol F, tetramethyl bisphenol F, bisphenol AD, hydroquinone, methylhydroquinone, dimethylhydro-quinone, dibutyl hydroquinone, resorcin, methylresorcin, biphenol, tetramethyl biphenol, dihydroxynaphthalene, dihydroxydiphenyl ether, phenol novolak resin, cresol novolak resin, bisphenol A novolak resin, dicyclopentadiene phenol resin, terpene phenol resin, phenol aralkyl resin, naphthol novolak resin, etc.) or various phenol type compounds such as polyhydric phenolic resins obtained by condensation reaction between various phenols and various aldehydes (e.g., hydroxybenzaldehyde, crotonaldehyde, glyoxal, etc.), and epihalohydrin; epoxy resins produced from various amine compounds (e.g., diaminophenyl methane, aminophenol, xylenediamine, etc.), and epihalohydrin; and epoxy resins produced from various carboxylic acids (e.g., methylhexahydrophthalic acid, dimer acid, etc.), and epohalohydrin.

Of those epoxy resins, crystalline epoxy resins having a melting point of 40° to 170° C., which are in crystalline solid state at ordinary temperature but are a liquid of low viscosity at molding upon melting, are preferred. Examples of those crystalline epoxy resins include epoxy resins produced from phenol type compounds such as bisphenol A, bisphenol F, tetramethylbisphenol F, hydroquinone, dimethylhydroquinone, dibutylhydroquinone, biphenol, tetramethylbiphenol, dihydroxynaphthalene, dihydroxydiphenyl ether, etc.) and epihalohydrin. In view of the properties of the cured products, epoxy resins produced from at least one phenol compound selected from biphenol and tetramethylbiphenol, and epihalohydrin are more preferred.

Brominated epoxy resins can be used as a part of the epoxy resin to be used so as to render the cured product flame retardant. Examples of the brominated epoxy resin include epoxy resins produced from brominated bisphenol A or brominated phenol novolak resin, and epihalohydrin.

The epoxy resin hardener (b) to be used in the epoxy resin composition for encapsulation of semiconductors of the present invention is an epoxy resin hardener comprising a partially aromatic-esterified phenol aralkyl resin represented by the above-described formula (I) as main component. In the formula (I), 10 to 90 mol %, and preferably more than 20 to less than 50 mol %, of the total X is the group represented by the above described formula (II).

The epoxy resin hardener represented by the formula (I) is a partially aromatic-esterified phenol aralkyl resin obtained by esterifying a certain proportion of phenolic hydroxyl groups in a phenol aralkyl resin represented by the following formula (III) with an esterifying agent which may have substituent groups and/or substituent atoms on a benzene ring, such as benzoic acid

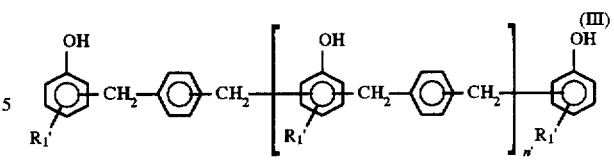

(where $R_1'$ represents hydrogen atom, hydrocarbon group having 1 to 10 carbon atoms, substituted or unsubstituted aromatic group, substituted or unsubstituted aralkyl group, or halogen atom, and n' is an integer of 0 to 10 on the average).

There are various methods for the partial esterification method of the phenol aralkyl resin. The representative method thereof is an esterification method using an esterifying agent represented by the following formula (IV)

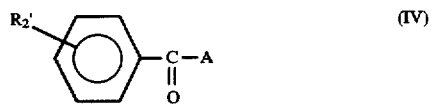

(where $R_2'$ represents hydrogen atom, hydrocarbon group having 1 to 10 carbon atoms, substituted or unsubstituted aromatic group, substituted or unsubstituted aralkyl group, or halogen atom, and A represents hydroxyl group, alkoxy group, substituted or unsubstituted phenoxy group, substituted or unsubstituted benzoate group, or halogen atom).

The esterification reaction can be carried out by various methods under various conditions, depending on the types of the phenol aralkyl resin and the esterifying agent as raw materials, the combination of the phenol aralkyl resin and the esterifying agent, and the like. The representative esterification method and the conditions thereof are that those raw materials are mixed in the presence or absence of a solvent as reaction medium, and reaction is performed at a temperature of 0° to 150° C. for 1 to 10 hours in the presence of a catalyst while mixing the resulting mixture. After the completion of the reaction, unreacted esterifying agent, by-products, solvent, and the like are removed, to obtain the objective partially aromatic-esterified phenol aralkyl resin.

Examples of the reaction catalyst which can be used in the esterification method include amines such as trimethylamine, triethylamine, benzyldimethylamine, dimethylaniline, or pyridine; alkali metal hydroxides such as sodium hydroxide, or potassium hydroxide; alkali metal alcolates such as potassium-t-butoxide, or sodium ethoxide; alkyl metals such as butyl lithium, or biphenyl sodium; organic acid salts showing acidity such as hydrochloric acid, sulfuric acid, oxalic acid, fluoroacetic acid, or toluenesulfonic acid; and acidic catalysts such as fluoroboric acid, heteropoly acids, polyphosphoric acids, or active clay.

Examples of the reaction solvent which can be used in the esterification method include inert organic solvents such as ketones (e.g., acetone, methyl ethyl ketone, or methyl isobutyl ketone), aromatic hydrocarbons (e.g., benzene, toluene, or xylene), ethers (e.g., dioxane, or ethylene glycol dimethyl ether), or aprotic polar solvents (e.g., dimethyl sulfoxide, or dimethyl formamide); and water.

In the partial esterification reaction of the phenol aralkyl resin, the proportion of each of the raw materials used and the reaction conditions must be adjusted such that the conversion of esterification of the partially aromatic-esterified phenol aralkyl resin finally obtained, viz., the proportion of the groups represented by the formula (II) in the total X in the formula (I), is fallen within the predetermined range (10 to 90 mol %, and preferably more than 20 to less than 50 mol %). The conversion of esterification may be adjusted by mixing at least two kinds of partially aromatic-esterified phenol aralkyl resins having different conversion of esterification.

Further, the epoxy resin composition for encapsulation of semiconductors according to the present invention can formulate hardeners other than the partially aromatic-esterified phenol aralkyl resin.

Examples of the other hardener which can be formulated include various polyhydric phenols such as bisphenol A, bisphenol F, bisphenol AD, hydroquinone, resorcin, methyl resorcin, biphenol, tetramethylbiphenol, dihydroxynaphthalene, dihydroxydiphenol ether, phenol novolak resin, cresol novolak resin, bisphenol A novolak resin, dicyclopentadiene phenol resin, terpene phenol resin, naphthol novolak resin, brominated bisphenol A, or brominated phenol novolak resin; various phenolic resins such as polyhydric phenol resin obtained by condensation reaction of various phenols and various aldehydes such as hydroxybenzaldehyde, crotonaldehyde, or glyoxal; active ester compounds obtained by esterifying (e.g., benzoating or acetating) the whole or part of phenolic hydroxyl groups of the various phenols (resins); acid anhydrides such as methyltetrahydrophthalic anhydride, hexahydrophthalic anhydride, pyromellitic anhydride, or methylnadic acid; and amines such as diethylene triamine, isophorone diamine, diaminodiphenyl methane, diamino-diphenyl sulfone, or dicyane diamide.

The amount of those other hardeners to be used is preferably less than 50% by weight based on the total weight of the epoxy resin hardeners. If the amount of the other hardeners to be used is too large, the effect of the present invention is not sufficiently exhibited.

If the content of the "aromatic ester bond" in the whole hardeners is too large, a cured product superior in moisture absorption can be obtained, but the curability is too slow, which is not practical. Further, if the content of other active groups such as phenolic hydroxyl group is too large, the curability is superior, but the cured product having sufficiently low moisture absorption cannot be obtained.

The amount of the epoxy resin hardener (b) to be used in the epoxy resin composition for encapsulation of semiconductors of the present invention should be such that the total number of groups in the hardener, which are reactive to epoxy groups, is preferably 0.5 to 1.5 mols, and more preferably 0.7 to 1.3 mols, per mole of epoxy groups in all the epoxy resin components.

The silica powder filler (c) is formulated in the epoxy resin composition for encapsulation of semiconductors of the present invention. The type of the silica powder filler is fused silica or crystalline silica, and the form thereof is crushed shape or spherical shape. Various silicas can be used alone or as mixtures of two or more thereof. The amount of the silica powder to be used is 60 to 95% by weight, and preferably 70 to 92% by weight, based on the total weight of the composition.

Further, the cure accelerator (d) used in the epoxy resin composition for encapsulation of semiconductors according to the present invention is a compound that accelerates the reaction between epoxy groups in the epoxy resin and "aromatic ester bonds " in the hardener, and the reaction between epoxy groups and phenolic hydroxyl groups.

Examples of the cure accelerator (d) which can be used in the epoxy resin composition for encapsulation of semiconductors of the present invention include phosphine compounds such as tributyl phosphine, triphenyl phosphine, tris(dimethoxyphenyl)phosphine, tris(hydroxypropyl) phosphine, or tris(cyanoethyl)phosphine; phosphonium salts such as tetraphenylphosphonium tetraphenyl borate, methyltributylphosphonium tetraphenyl borate, or methyltricyano-ethylphosphonium tetraphenyl borate; imidazoles such as 2-methyl imidazole, 2-phenylimidazole, 2-ethyl-4-methyl imidazone, 2-undecyl-imidazole, 1-cyanoethyl-2-methylimidazole, 2,4-dicyano-6-[2-methyl-imidazolyl-(1)]-ethyl-S-triazine, or 2,4-dicyano-6-[2-undecylimida-zolyl-(1)]-ethyl-S-triazine; imidazolium salts such as 1-cyanoethyl-w-undecylimidazolium trimellitate, 2-methylimidazolium isocyanurate, 2-ethyl-4-methylimidazolium tetraphenyl borate, or 2-ethyl-1,4-dimethyl-imidazolium tetraphenyl borate; amines such as 2,4,6-tris(dimethylaminomethyl)phenol, benzyldimethyl amine, tetramethylbutyl guanidine, N-methyl piperadine, or 2-dimethylamino-1-pyroline; ammonium salts such as triethylammonium tetraphenyl borate; diazabi-cyclo compounds such as 1,5-diazabicyclo(2,2,2)-octane; and tetraphenyl borates, phenol salts, phenol novolak salts, or 2-ethyl-hexanoic acid salts of the diazabicyclo compounds.

Of those compounds to be used as the curing, accelerator, phosphine compounds, imidazole compounds, diazabicyclo compounds, and their salts are preferred.

Those curing accelerators (d) are used alone or as mixtures of two or more thereof, and the amount thereof to be used is 0.1 to 7% by weight, and preferably 1 to 5% by weight, based on the weight of the epoxy resin (a).

If necessary, coupling agents, plasticizers, pigments, and the like can appropriately be formulated in the epoxy resin composition for encapsulation of semiconductors of the present invention.

Further, flame retardant aids such as anitmony trioxide or phosphoric acid can also be formulated in the epoxy resin composition for encapsulation of semiconductors of the present invention.

EXAMPLES

The present invention is explained below in more detail by the production examples of partially aromatic-esterified phenol aralkyl resins to be used in the epoxy resin composition for encapsulation of semiconductors of the present invention and the examples and the comparative examples of the epoxy resin composition for encapsulation of semiconductors of the present invention, but the invention is not construed as being limited thereto.

Production Examples 1 to 3 of Partially Aromatic-Esterified Phenol Aralkyl Resin A three-necked flask having an inner volume of three liters equipped with a thermometer, a stirrer and a cooling pipe was charged with phenol aralkyl resin, benzoyl chloride and pyridine in the amounts shown in Table 1 below. The resulting mixture was kept at 30° C. for 2 hours to conduct the reaction.

Subsequently, 1,000 g of methyl isobutyl ketone were added to the flask and completely dissolved. After removing by-product sales and the like by water washing, methyl isobutyl ketone was removed under reduced pressure to obtain the desired partially aromatic-esterified phenol aralkyl resins.

Phenolic hydroxyl group content, aromatic ester bond content, conversion of esterification, and softening point of those partially aromatic-esterified phenol aralkyl resins were measured. The results obtained are shown in Table 1 below.

Examples 1 to 4 and Comparative Examples 1 to 3

As shown in Table 2 below, epoxy resin derived from tetra-methyl biphenol, epoxy resin derived from biphenol and tetramethyl biphenol, and orthocresol novolak type epoxy resin were used as epoxy resin (a), brominated bisphenol A type epoxy resin was used as brominated epoxy resin, each of the partially aromatic-esterified phenol aralkyl resins produced by Production Examples 1 to 3, a commercially available phenol novolak resin, and a commercially available phenol aralkyl resin were used as epoxy resin hardener (b), a crushed type fused silica powder was used as silica powder filler (c), 1,5-diazabicyclo(5,4,0)-7-undecene, tris(dimethoxyphenyl)phosphine, or 2-phenylimidazole was used as the curing accelerator (d), antimony trioxide was used as flame retardant aid, epoxy silane was used as filler surface treating agent, and carnauba wax was used as mold release agent. Each of epoxy resin compositions was formulated.

Each formulation was melt mixed at a temperature of 70° to 130° C. for 5 minutes using a mixing roll. Each of the molten mixture was taken out in the form of sheet, and crushed to obtain each molding material.

Each of those molding materials was molded with a low pressure transfer molding machine at a mold temperature of 180° C. for a molding time of from 160 to 300 seconds to obtain each test piece, and each test piece was post-cured at 180° C. for 8 hours. Further, a gel time of each molding material was measured.

The gel time, and the molding time, and the results of the test of water absorption and glass transition point of each of the test piece obtained therefrom after post-cure are shown in Table 2 below.

It is understood from the results shown in Table 2 above that each of the molding materials obtained in Examples 1 to 4 are superior in balance of curability (i.e., short gel time and short mold time) and low moisture absorption to the molding materials obtained in Comparative Examples 1 to 3.

The epoxy resin composition for encapsulation of semiconductors according to the present invention is superior in curability, and can yield a cure product having superior moisture absorption. Therefore, the epoxy resin composition of the present invention can advantageously be used in encapsulation of semiconductors.

|  | Production Example 1 | Production Example 2 | Production Example 3 |
|---|---|---|---|
| Production Conditions |  |  |  |
| Amount of phenol aralkyl resin* (g) | 519 | 519 | 519 |
| Amount of benzoyl chloride (g) | 168 | 336 | 295 |
| Amount of pyridine (g) | 500 | 500 | 300 |
| Analytical Results |  |  |  |
| Phenolic hydroxyl group content (meq/g) | 3.2 | 1.0 | 0.15 |
| Aromatic ester bond content (meq/g) | 2.0 | 1.0 | 3.5 |
| Conversion of esterification (mol %) | 38 | 75 | 96 |
| Softening point (°C.) | 80 | 82 | 82 |

*Phenol aralkyl resin (a product of Mitsui-Toatsu Chemicals, Inc., MILEX XL225LL, hydroxyl equivalent: 173, softening point: 78° C.)

|  |  | Example 1 | Example 2 | Example 3 | Example 4 | Comparative Example 1 | Comparative Example 2 | Comparative Example 3 |
|---|---|---|---|---|---|---|---|---|
| Epoxy Resin Composition Formulation (Parts by weight) | Epoxy resin (a) | A | A | B | C | A | A | C |
|  | Amount | 100 | 100 | 100 | 100 | 100 | 100 | 100 |
|  | Brominated epoxy resin*1 | 10 | 10 | 10 | 10 | 10 | 10 | 10 |
|  | Epoxy resin hardener (b) | Production Example 1 | Production Example 2 | Production Example 3 | Production Example 2 | Production Example 3 | D | E |
|  | Amount | 115 | 136 | 73 | 75 | 147 | 94 | 51 |
|  | Epoxy resin hardener | — | — | D | E | — | — | — |
|  | Amount | — | — | 52 | 20 | — | — | — |
|  | Inorganic filler (c)*2 | 715 | 778 | 745 | 655 | 811 | 652 | 523 |
|  | Cure accelerator (d) | F | F | G | H | F | F | F |
|  | Amount | 1.5 | 1.5 | 1.5 | 1.5 | 1.5 | 1.5 | 1.0 |
|  | Flame retardant aid*3 | 10 | 10 | 10 | 10 | 10 | 10 | 10 |
|  | Mold release agent*4 | 1 | 1 | 1 | 1 | 1 | 1 | 1 |
|  | Coupling Agent*5 | 1 | 1 | 1 | 1 | 1 | 1 | 1 |
| Curability | Gel time*6 (sec) | 55 | 67 | 53 | 53 | 92 | 53 | 55 |
|  | Molding time (sec) | 170 | 230 | 160 | 160 | 330 | 160 | 170 |
| Properties of Cured Product | Moisture absorption*7 (%) | 0.15 | 0.12 | 0.15 | 0.18 | 0.10 | 0.32 | 0.51 |
|  | Glass transition temperature*8 (°C.) | 117 | 115 | 131 | 154 | 114 | 117 | 156 |

A Epoxy resin derived from tetramethylbiphenol (trade name: EPIKOTE YX4000H; produced by Yuka Shell Epoxy K. K., epoxy equivalent: 193)
B Epoxy resin derived from biphenol and tetramethylbiphenol (trade name: EPIKOTE YL6121H, produced by Yuka Shell Epoxy K. K., epoxy equivalent: 173)
C Orthocresol novolak type epoxy resin (trade name: EPIKOTE 180S65, produced by Yuka Shell Epoxy K. K., epoxy equivalent: 213)
D Phenol aralkyl resin (trade name: MILEX XL225LL, produced by Mitsui-Toatsu Chemicals, Inc., hydroxyl equivalent: 173, softening point: 78° C.)
E Phenol novolak resin (produced by Gunei Chemicals Co., hydroxyl equivalent: 103, softening point: 85° C.)
F 1,5-diazabicyclo(5,4,0)-7-undecene
G Tris(dimethoxyphenyl)phosphine
H 2-Phenylimidazole
*1 Brominated bisphenol A type epoxy resin (trade name: EPIKOTE 5050, produced by Yuka Shell Epoxy K. K., epoxy equivalent: 385, bromine content: 49%)
*2 Crushed type fused silica powder (trade name: RD-8, produced by Tatsumori Co.)
*3 Antimony trioxide

*⁴Carnauba wax
*⁵Epoxy silane (trade name: KBM-403, produced by Shin-Etsu Chemical Co.)
*⁶175° C.
*⁷Moisture absorption at 85° C. and 85% RH for 168 hours
*⁸Determined from transition point in thermal expansion curve using TMA

What we claim is:

1. An epoxy resin composition comprising:
   (a) an epoxy resin;
   (b) an epoxy resin hardener comprising a partially aromatic-esterified phenol aralkyl resin represented by the following formula (I):

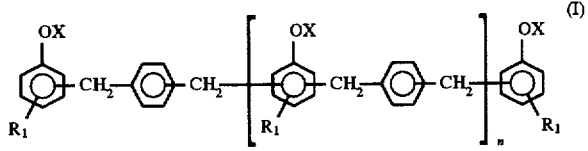

wherein X represents a hydrogen atom or a group represented by formula (II), with the proviso that 10 to 90 mol % of X groups are represented by the formula (II); $R_1$ represents hydrogen atom, a hydrocarbon group having 1 to 10 carbon atoms, a substituted or unsubstituted aromatic group, a substituted or unsubstituted aralkyl group, or halogen atom; and n is an integer of 0 to 10 on the average; and formula II is represented as:

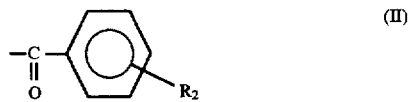

wherein $R_2$ represents a hydrogen atom, a hydrocarbon group having 1 to 10 carbon atoms, a substituted or unsubstituted aromatic group, a substituted or unsubstituted aralkyl group, or a halogen atom;

(c) silica powder filler; and
   (d) cure accelerator.

2. The epoxy composition of claim 1, wherein the epoxy resin (a) comprises a crystalline epoxy resin having a melting point of 40° to 170° C.

3. The epoxy resin composition of claim 1, wherein the epoxy resin comprises the reaction product of at least one kind of phenol compound selected from the group consisting of biphenol and tetramethylbiphenol, and epihalohydrin.

4. The epoxy resin composition of claim 1, wherein the epoxy resin hardener (b) contains a partially aromatic-esterified phenol aralkyl resin in which more than 20 to less than 50 mol % of all X in the formula (I) are groups represented by the formula (II), the epoxy resin hardener (b) being present in an amount of 50% by weight or more based on the weight of all hardeners.

5. The epoxy resin composition for encapsulation of semiconductors as claimed in claim 1, wherein the epoxy resin hardener (b) is formulated in an amount such that a molar ratio of epoxy groups in the epoxy resin (a) to groups which are reactive to epoxy groups in the epoxy resin hardener (b) is 1:0.5 to 1:1.5.

* * * * *